(12) United States Patent
Pluymers

(10) Patent No.: US 6,590,478 B2
(45) Date of Patent: Jul. 8, 2003

(54) SHORT COAXIAL TRANSMISSION LINE AND METHOD FOR USE THEREOF

(75) Inventor: Brian Alan Pluymers, Haddonfield, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 49 days.

(21) Appl. No.: 09/801,498

(22) Filed: Mar. 8, 2001

(65) Prior Publication Data

US 2002/0153976 A1 Oct. 24, 2002

(51) Int. Cl.[7] .............................. H01P 1/04; H01R 13/17
(52) U.S. Cl. ........................ 333/246; 333/260; 439/827
(58) Field of Search .................................. 333/239, 260, 333/246, 254; 174/88 C; 29/601; 439/825–827, 816, 581, 584, 578

(56) References Cited

U.S. PATENT DOCUMENTS

| | | | | |
|---|---|---|---|---|
| 3,181,044 A | * | 4/1965 | Duncan | 439/842 |
| 4,662,706 A | * | 5/1987 | Foley | 439/843 |
| 4,750,897 A | * | 6/1988 | Neidecker | 439/825 |
| 5,653,615 A | * | 8/1997 | Inaba et al. | 439/827 |
| 5,945,897 A | | 8/1999 | Pluymers et al. | 333/244 |
| 5,951,337 A | * | 9/1999 | Brake | 439/825 |
| 6,025,760 A | * | 2/2000 | Tang | 333/260 |
| 6,031,188 A | | 2/2000 | Pluymers et al. | 174/255 |
| 6,081,988 A | | 7/2000 | Pluymers et al. | 29/601 |
| 6,081,989 A | | 7/2000 | Pluymers et al. | 29/601 |
| 6,094,115 A | * | 7/2000 | Nguyen et al. | 333/246 |
| 6,336,821 B1 | * | 1/2002 | Hattori | 439/282 |

OTHER PUBLICATIONS

Gilbert Engineering Product Information, 1999 Gilbert Engineering Co., Inc. G–1400–553, 1999.

* cited by examiner

Primary Examiner—Seungsook Ham
(74) Attorney, Agent, or Firm—Duane Morris LLP

(57) ABSTRACT

An arrangement for interconnecting RF ports on mutually parallel printed-circuit boards includes an arrangement of a ladder-shaped conductive foil or thin plate rolled to make a cylindrical inner conductor, and another arrangement of a ladder-shaped conductive foil rolled to make an outer conductor, with the ladder "rungs" being parallel to the axis of the interconnection. The rungs are long slender columns, which deflect laterally or "bulge" in response to axial forces. The inner and outer conductors are spaced apart by a dielectric solid material, preferably elastomeric.

11 Claims, 10 Drawing Sheets

SHORT COAXIAL TRANSMISSION LINE AND METHOD FOR USE THEREOF

FIELD OF THE INVENTION

This invention relates to electromagnetic transmission lines, and more particularly to short coaxial transmission lines, and methods for using such transmission lines to interconnect RF ports on mutually parallel printed-circuit boards.

BACKGROUND OF THE INVENTION

FIG. 1 is a simplified perspective or isometric view of a combination 10 of modules, including a main module mated with a plurality of other modules. In FIG. 1, a rectangular, somewhat planar housing 12 contains at least one printed-circuit board lying in the plane parallel to dash line 14, which is to say parallel to that one of the two broad faces, namely near face 12*fn*. A second housing designated 16*a* is one of a set 16 of additional housings, illustrated in phantom, which are adapted to be coupled to housing 12 for the flow of electromagnetic energy therebetween by way of coaxial transmission-line structures.

As is well known to those skilled in the art, a coaxial transmission line includes a center conductor lying within, and concentric with, a cylindrical outer conductor. Coaxial transmission lines take many forms, but all are characterized by the flow of electromagnetic energy in the region or space between the center and outer conductors. The generally accepted meaning of a transmission line, as opposed to simple "wires," is that the surge impedance or characteristic impedance of the transmission line tends to be constant along its length, or if the impedance changes along its length, the change is effected in a controlled manner which tends to minimize overall reflection of energy, so that energy introduced into one end of the transmission line is "transmitted" to the remote end with a minimum of loss attributable to mismatch. While coaxial transmission lines may be made to have almost any characteristic impedance, two such impedances are most common. The nominal impedance of 50 ohms is theoretically capable of handling the highest power without voltage breakdown, while the nominal impedance of 75 ohms theoretically provides the least loss per unit length. Military equipments such as radar and other transmitting devices requiring high power thus tend to use 50-ohm transmission lines and associated connectors, while some commercial users such as cable television have, at least in the past, operated at 75 ohms.

In the arrangement of FIG. 1, the coupling between module 16*a* and a portion of module 12 is provided by coaxial connectors of a set 18*a* of such connectors, not entirely illustrated in FIG. 1. In FIG. 1, portions of four connectors 18*a*1, 18*a*2, 18*a*3, and 18*a*4 associated with module 16*a* are illustrated. It should be understood that this number, and their layout, are illustrative only, and that there may be more or fewer such connectors associated with each module of set 16 of modules.

In order to minimize losses in interconnecting transmission lines, and to minimize the volume occupied by the combined modules 10 of FIG. 1, it is desirable to have each module 16*x* of set 16 of modules immediately adjacent the near or facing surface 12*fn* of module 12. In order to accomplish a close spacing, it is possible to use as connectors type GPO interconnects, manufactured by Gilbert Engineering, whose address is 5310 W Camelback Road, Glendale, Ariz. 85301. These connectors are characterized from DC to 40 GHz.

FIG. 2*a* is a simplified, exploded view of a particular version of the GPO connector, adapted for connecting conductive traces on a printed circuit board to conductive traces on another such board, and FIG. 2*b* represents a cross-section of a portion of the arrangement of FIG. 1 in its assembled state. For specificity, FIGS. 2*a* and 2*b* illustrates connector 18*a*1 of FIG. 1. In FIG. 2*a*, 214*a* represents a portion of the printed circuit board lying within housing 12 in plane 14, and 214*b* represents another printed circuit board lying within housing 16*a*. In this particular layout, the two printed circuit boards 214*a* and 214*b* lie mutually parallel.

In the arrangement of FIGS. 2*a* and 2*b*, both printed-circuit boards are "stripline" boards, in that the transmission lines within each board lie between ground planes. In FIGS. 2*a* and 2*b*, printed-circuit board 214*a* includes a near ground plane 214*agn* and a remote or far ground plane 214*agf*. Lying between ground planes 214*agn* and 214*agf* are two layers of dielectric or insulating material, a near layer 214*am* and a far layer 214*aif*. Lying between insulating layers 214*am* and 214*aif* is plane 14 of FIG. 1, and lying "in" the plane are a plurality of conductive traces, one of which is illustrated as 214*act*. It should be understood that the "plane" 14 is conceptual, as a plane is dimensionless and therefore cannot contain a three-dimensional object such as trace 214*act*, however thin.

In FIGS. 2*a* and 2*b*, a circular aperture 214*aga* is defined in ground plane 214*agn*, thereby exposing the near surface 214*ains* of near dielectric or insulating layer 214*ain*. Near the center of aperture 214*aga*, a conductive pad 214*acp* is affixed to the near surface 214*ains* of near dielectric layer 214*ain*, and is electrically coupled, as by a plated-through via 214*av*, to an end of the underlying conductive trace 214*act*.

Also in FIG. 2*a* is another printed circuit board 214*b*, which is similar in its construction to printed circuit board 214*a*, but which appears somewhat different, since it is seen from the rear rather than from the front. Elements of circuit board 214*b* corresponding to those of 214*a* are designated by the same reference numerals, but in the "214*b*" series rather than in the "214*a*" series. Thus, printed-circuit board 214*b* shows a near ground plane 214*bgn*, a far ground plane 214*bgf*, a near dielectric layer 214*bin*, a far dielectric layer 214*bif*, with a conductive trace 214*bct* extending therebetween, and ending at the center of an aperture 214*bga* in near ground plane 214*bgn*.

The GPO connector 18*a* of FIG. 2*a* includes two surface connector portions 210*a* and 210*b*, together with a "bullet" portion 216, some of which is also visible in the cross-section of FIG. 2*b*. Surface connector portion 210*a* is illustrated as including three portions exploded away from each other. Surface connector portion 210*a* includes an outer conductor or flange portion 210*aoc*, an inner conductor portion 210*aic*, and a cylindrical insulator portion 210*ai*. As illustrated, outer conductor 210*aoc* includes a tubular body portion 210*aocb*, a lower flange 210*aoclf*, and a strengthening flange 210*aocsf*. Body 210*aocb* of outer conductor 210*aoc* defines an inner bore 210*aocbb* which is dimensioned to accept the outer diameter of cylindrical insulator portion 210*ai*. Cylindrical insulator portion 210*ai* contains an axial bore dimensioned to accommodate the body portion of center or inner conductor portion 210*aic*. Assembly of surface connector portion 210*a* to printed circuit board 214*a* is accomplished by soldering or otherwise metallurgically connecting an end of center conductor portion 210*aic* to the center pad 214*acp*. The bore of insulator 210*ai* is then fitted over the protruding center conductor, the outer conductor 210*aoc* is fitted over and around insulator 210*ai*, and the lower flange 210*aoclf* is then soldered to that portion of the near ground plane 214*agn* surrounding aperture 214*aga* defined by dashed circle 214*ac*.

Connector portion 210*b* of connector 18*a* of FIG. 2*a* is similar to portion 210*a*, and is similarly affixed to printed circuit board 214*b*. More particularly, the end of inner conductor 210*bic* is soldered or otherwise metallurgically connected to a pad (not designated) connected to the end of conductive trace 214*bct* so that it projects away from the surface of the board 214*b*. Dielectric insulator 210*bi* is fitted over protruding inner conductor 210*bic*. Outer conductor 210*boc* is then fitted over insulator 210*bi* with its lower flange abutting that portion of near ground plane 214*bgn* surrounding aperture 214*bga*.

With both surface connector portions 210*a* and 210*b* of connector 18*a* fastened to their respective printed circuit boards 214*a* and 214*b*, the surface connector portions are aligned with axis 8, and brought together with bullet portion 216 of connector 18*a* therebetween. Bullet portion 216 includes a plurality of elongated conductive strips 216*oc*$_1$, 216*oc*$_2$, ... fastened about a generally cylindrical dielectric body 216 with their axes of elongation coaxial with the local axis (which in the illustration is axis 8) and held in place by a spring ring 216*ocr*. The inner conductor is generally similar to the outer conductor. When the bullet portion 216 of connector 18*a* is pressed against the assembled surface portions 210*a* and 210*b*, the ends of the center conductor of bullet portion 216 spreads slightly to fit over the two center pins 210*aic* and 210*bic*, and the two ends of the outer conductor made up of pieces 216*oc*$_1$, 216*oc*$_2$, ... contract slightly to fit within bore 210*aocbb* of the strengthening flange portions 210*aocsf* and of the equivalent bore associated with strengthening flange 210*bocsf*. In this fashion, the GPO connector set 18*a* of FIGS. 2*a* and 2*b* provides for a suitable transmission line interconnecting the two mutually parallel printed circuit boards 214*a* and 214*b*.

It will be understood that each printed-circuit board 214*a* and 214*b* of FIG. 2*a* may be mounted within its own protective housing or module, with the surface mounting portions 210*a* and 210*b* projecting through one or more sides of the housing in the manner suggested in FIG. 1, and with the bullet portion of each connector as a separate item which is assembled to one or both sides of the module pair to be interconnected.

While the GPO connectors provide good connection between conductors on mutually parallel boards. they have disadvantages including relatively high cost. The assembly of each connector imposes an additional cost. A connector arrangement with the potential for lower cost would be advantageous.

SUMMARY OF THE INVENTION

An assemblage according to an aspect of the invention includes a first stripline board including first and second ground planes, and a circuit trace lying between the first and second ground planes. The first ground plane defines a circular first electromagnetic coupling aperture, and a conductive center trace lies at the center of the first electromagnetic coupling aperture, to thereby define, in cross-section, a first coaxial transmission line structure. The center trace of the first coupling aperture connects by way of a plated-through via to an end of the circuit trace of the first stripline board. A second stripline board includes first and second ground planes, and a circuit trace lying between the first and second ground planes of the second stripline board. The first ground plane of the second stripline board defines a circular second electromagnetic coupling aperture and a conductive center trace at the center of the second electromagnetic coupling aperture, to thereby define, in cross-section, a second coaxial transmission line essentially identical to the first coaxial transmission line. The center trace of the second coupling aperture connects by way of a plated-through via to an end of the circuit trace of the second stripline board. A separator defines two parallel planar surfaces spaced from each other by a predetermined distance. The separator defines a circular through aperture extending between the parallel planar surfaces. The through aperture is larger in diameter than the first and second coupling apertures, and the separator is physically fastened to the first and second stripline boards so that the through aperture is concentric with the first and second electromagnetic coupling apertures. An axially compliant third coaxial transmission line insert includes a center conductor coaxial with an outer conductor. At least one of the center conductor and the outer conductor of the third coaxial transmission line is in the form of a conductive ladder-shaped spring structure defining a plurality of rungs lying between elongated parallel members, which elongated members are formed into curved shapes resembling circles, or at least portions thereof, so that the rungs lie generally parallel with each other and with the axis of the other one of the center conductor and the outer conductor. The axially compliant third coaxial transmission line lies within the through aperture with a first end of the center conductor abutting the center trace of the first coaxial transmission line and a second end of the center conductor abutting the center trace of the second coaxial transmission line, and with a first end of the outer conductor of the coaxial third transmission line abutting the first ground plane of the first stripline board in a region surrounding the through aperture of the first stripline board, and with a second end of the outer conductor of the coaxial third transmission line abutting the first ground plane of the second stripline board in a region surrounding the through aperture of the second stripline board.

In a particularly advantageous avatar of the invention, both the center conductor and the outer conductor of the third coaxial transmission line are in the form of a conductive ladder-shaped spring structure defining a plurality of rungs lying between elongated parallel members, with the elongated members formed into curved structures so that the rungs lie generally parallel with each other and with the axis of the other one of the center conductor and the outer conductor. In such an arrangement, the elongated portions of the planar structures which are formed into circles may overlap so that more than a complete "turn" of structure is formed, or may not quite overlap, so that a "gap" lacking one or more rungs is left in one side of the structure. In this particularly advantageous avatar, the rungs of either the center conductor or the outer conductor of the third coaxial transmission line may bulge away from the axis of third coaxial transmission line at regions remote from the elongated members, to thereby form a somewhat barrel shape.

In a particular version of the structure, a generally barrel-shaped dielectric form may occupy the interstice between the center and outer conductors, and in a mode of making the connections, the dielectric form may have the ladder of the outer conductor wound thereabout. This dielectric form is a solid, but may be an elastomeric solid. The conductors of the ladders may comprise beryllium copper.

A method according to an aspect of the invention is for interconnecting transmission paths defined on the surface of first and second separated stripline boards, where the transmission paths are in the form of a circular aperture defined in a conductive ground plane of the associated stripline board, together with a conductive trace located at the center of the aperture. The method includes the step of making a center conductor having a nominal diameter by forming a first electrically conductive planar ladder-shaped spring structure defining two elongated parallel elements and a plurality of rungs extending therebetween into a tube-like form defined about an axis, so that the rungs lie parallel with the axis. The method includes the forming of a second electrically conductive planar ladder-shaped spring structure defining two elongated parallel elements and a plurality of rungs extending therebetween into a second tube-like form defined about an axis, so that the rungs lie parallel with the axis, to thereby define an outer conductor having a nominal diameter greater than the nominal diameter of the center conductor. The center conductor is placed coaxially within the outer conductor to thereby form a coaxial transmission line. The first and second stripline boards are juxtaposed with the circular apertures facing each other, and with the center and outer conductors of one end of the coaxial transmission line abutting the central trace and that portion of the ground plane surrounding the circular aperture, respectively, of the transmission path of the first stripline board, and with the center and outer conductors of the other end of the coaxial transmission line abutting the central trace and that portion of the ground plane surrounding the circular aperture, respectively, of the transmission path of the second stripline board, to thereby establish a coaxial transmission path between the transmission paths of the first and second stripline boards. The first and second stripline boards are then fastened together, including by way of intermediary structures, with the coaxial transmission path in place.

DESCRIPTION OF THE INVENTION

Figure 3A:
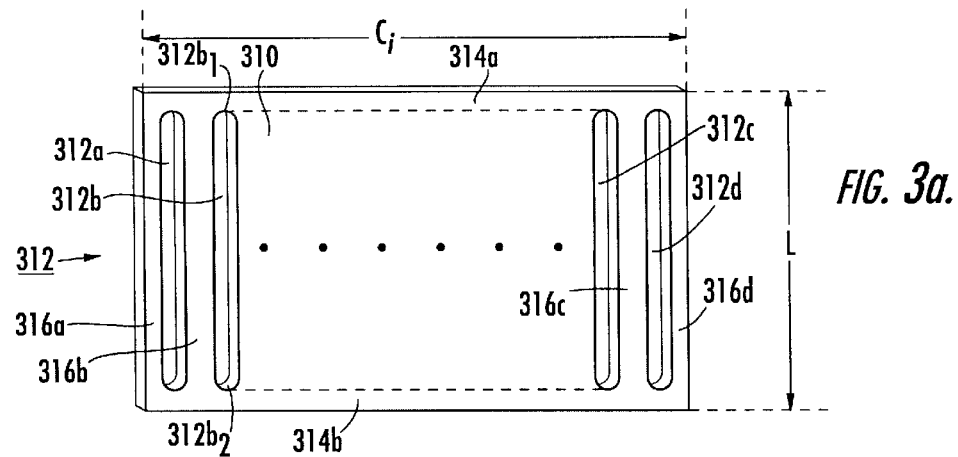
FIGS. 3a and 3b are perspective or isometric views of planar "ladder" structures which are a starting condition for inner and outer conductors, respectively, of a connector according to an aspect of the invention.

FIG. 3a is a simplified perspective or isometric view of an electrically conductive planar spring structure 310 in the general form of a thin plate or foil. The plate 310 defines a set of apertures 312 including a plurality of elongated mutually parallel apertures, some of which are designated 312a, 312b, . . . , 312c, and 312d. These apertures can be formed by selective etching. Each of the apertures has rounded ends, such as rounded ends $312b_1$ and $312b_2$. The plurality of apertures of set 312 forms plate 310 into a structure somewhat resembling a ladder, including elongated "sides" 314a and 314b and a set 316 including a plurality of elongated rungs 316a, 316b, . . . , 316c, and 316d. The overall length of the "ladder" of FIG. 3a, as described below, is dimensioned to equal the circumference of an inner conductor, so is designated as dimension $C_i$. The other major dimension of plate 310 is defined as dimension "L."

Figure 3B:
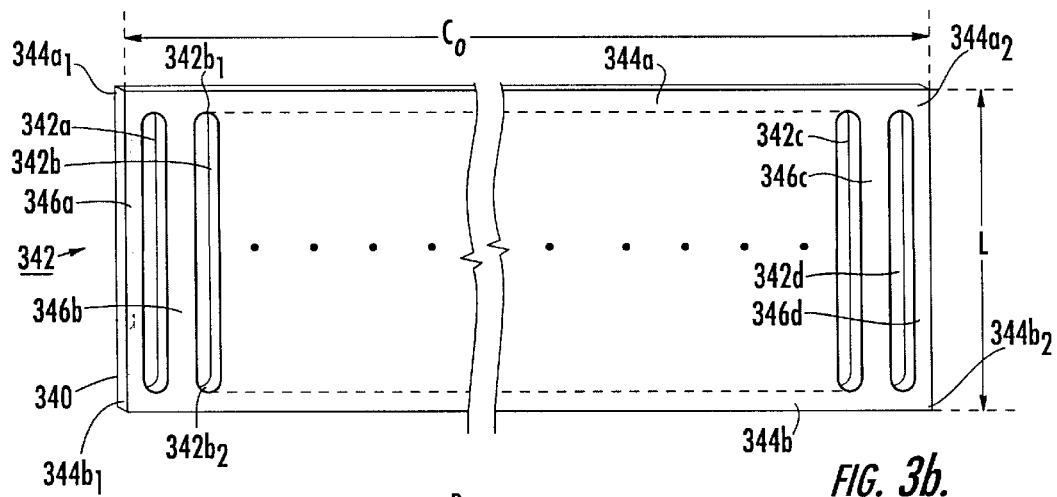

FIG. 3b is a simplified perspective or isometric view of an electrically conductive planar spring structure 340 in the general form of a thin plate or foil. The plate 340 defines a set 342 including a plurality of elongated mutually parallel apertures, some of which are designated 342a, 342b, . . . , 342c, and 342d. Each of the apertures has rounded ends, such as rounded ends $342b_1$ and $342b_2$. The plurality of apertures of set 342 forms plate 340 into a structure somewhat resembling a ladder, including elongated "sides" 344a and 344b and a set 346 including a plurality of elongated rungs 346a, 346b, . . . , 346c, and 346d. The overall length of the "ladder" of FIG. 3b, as described below, is dimensioned to equal the circumference of an outer conductor, so the length of the ladder between first and second ends $344a_1$ and $344a_2$ of side 344a, and between first and second ends $344b_1$ and $344b_2$ of side 344b, is designated as dimension $C_o$. The other major dimension of plate 340 is defined as dimension "L."

Figure 3C:
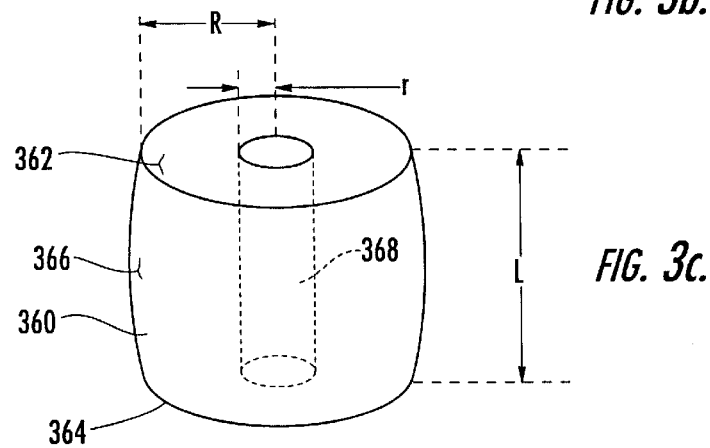
FIG. 3c is a perspective or isometric view of a dielectric support piece for the connector.

FIG. 3c is a perspective or isometric view of a dielectric, preferably elastomeric piece 360 having the general external shape of a barrel including a flat top 362 defining a radius R, a similar and parallel flat bottom 364, and a somewhat bulging or convex circumferential side 366. In one embodiment, dielectric piece 360 is solid, and defines an axial bore 368 having a diameter r. When used with the ladders 310 and 340 of FIGS. 3a and 3b, respectively, the larger radius R of the dielectric piece 360 is approximately equal to $C_o/2\pi$, and the smaller radius r of the axial bore 368 is equal to $C_i/2\pi$. Radius R is about 10% greater than radius r.

Figure 4:
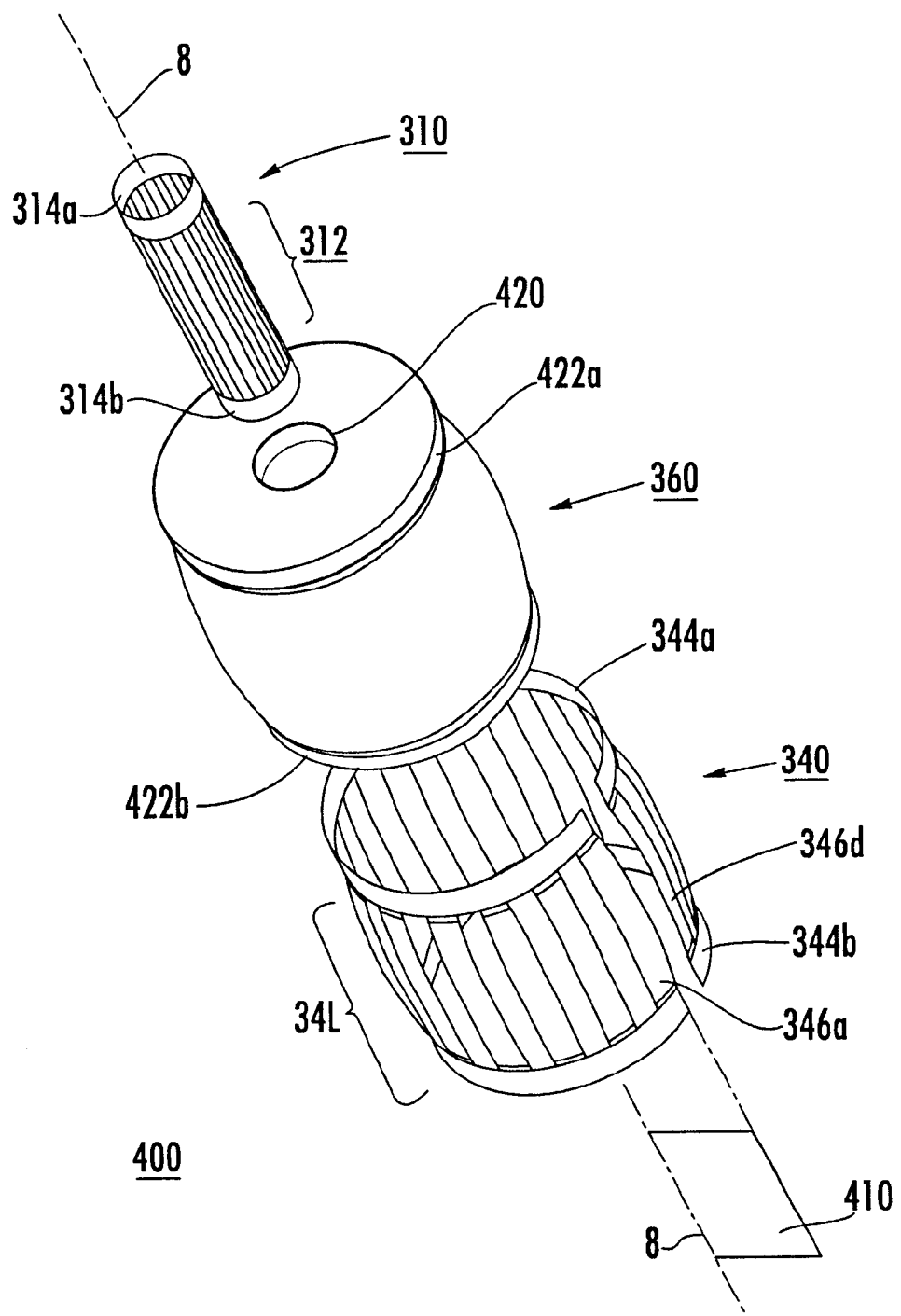
FIG. 4 is an exploded view of the ladders of FIGS. 3a and 3b fashioned into center and outer conductors, respectively, exploded away from the support dielectric of FIG. 3c.

With the dimensions $C_o/2\pi$ and $C_i/2\pi$ for radii R and r of dielectric piece 360 of FIG. 3c, the ladders 310 and 340 of FIGS. 3a and 3b, respectively, can be formed into roughly cylindrical shapes and applied to the dielectric piece 360. FIG. 4 is a simplified perspective or isometric view of a bullet connector 400 according to an aspect of the invention, in which the ladders of FIGS. 3a and 3b rolled or formed into inner and outer conductors, respectively, exploded away from the dielectric piece of FIG. 3c. In FIG. 4, the inner conductor ladder sides 314a and 314b are longitudinally disposed relative to axis 8, and are formed into circles surrounding the axis. The rungs of set 312 of rungs extend generally parallel with axis 8. Similarly, the outer conductor ladder sides 344a and 344b are longitudinally disposed relative to axis 8, and are formed into circles surrounding the axis. The rungs of set 342 of rungs extend generally parallel with axis 8. As is indicated by the break in ladder sides 344*a* and 344*b* near a plane 410 which includes the axis 8, the circle made by the ladder sides 344*a* and 344*b* need not fully completed. As an alternative, the ends of ladder sides 344*a* and 344*b* may overlap somewhat. As illustrated in FIG. 4, the dielectric piece 360 may define a right-circular-cylindric portion 422*a* adjacent the top, and another right-circular-cylindric portion 422*b* at the bottom of the dielectric piece, to accommodate the sides 344*a* and 344*b* of the ladder.

Figure 5A:
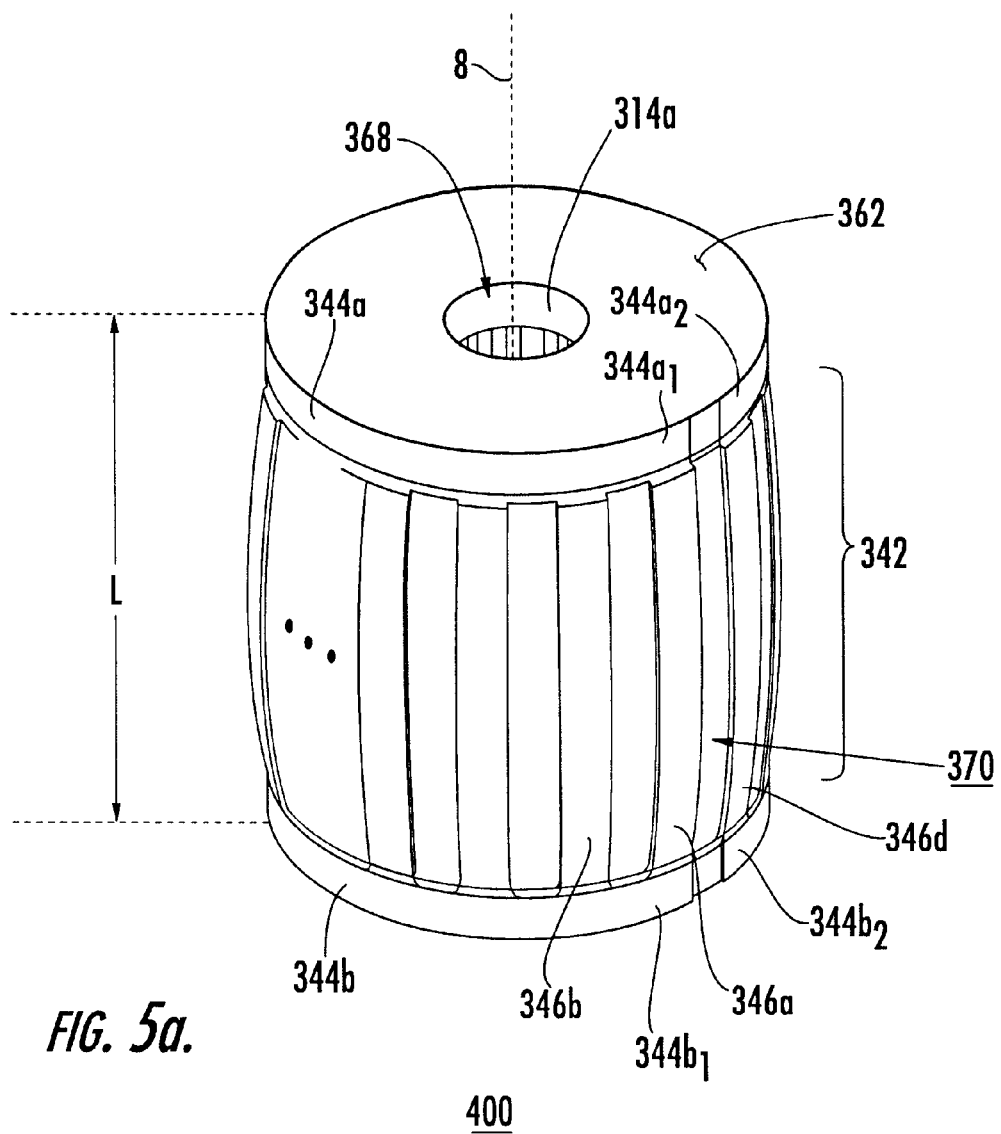
FIG. 5a is a simplified perspective or isometric view of the arrangement of FIG. 4, with the center and outer conductors assembled to the support dielectric without overlap.
Figure 5B:
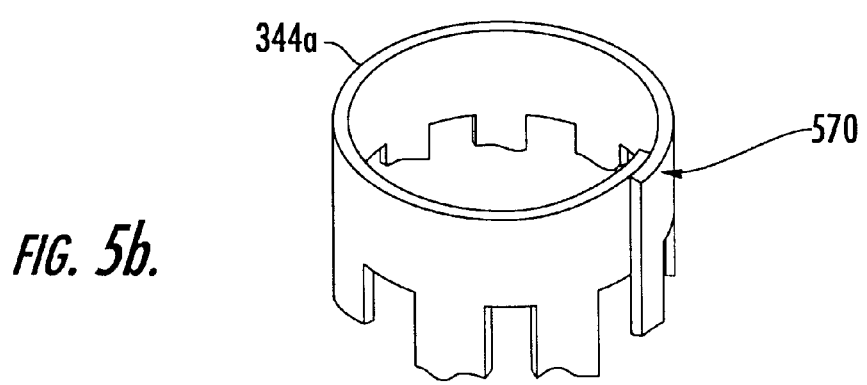
FIG. 5b illustrates a portion of the arrangement of FIG. 5a with overlap.

FIG. 5*a* is a simplified perspective or isometric view of an assembled "bullet" connector 400 according to an aspect of the invention. In FIG. 5*a*, the completed structure has an axial length L, and the inner conductor 310 lies axially within outer conductor 340. The rolled-up or cylindrical inner conductor 310 can compress slightly in diameter in order to be accommodated within the axial bore 368, and the rolled-up outer conductor 340 can expand slightly, due to the fact that the ends of the rolled-up structures are not physically fastened together. Thus, the rolled structures have a certain amount of spring, which allows the conductors to be affixed to the dielectric support to form the complete bullet 400. FIG. 5*b* illustrates the elongated member 344*a* of FIG. 5*a* alone, with only portions of the rungs attached thereto. The two ends of the elongated structure overlap in a region 570.

Figure 6A:
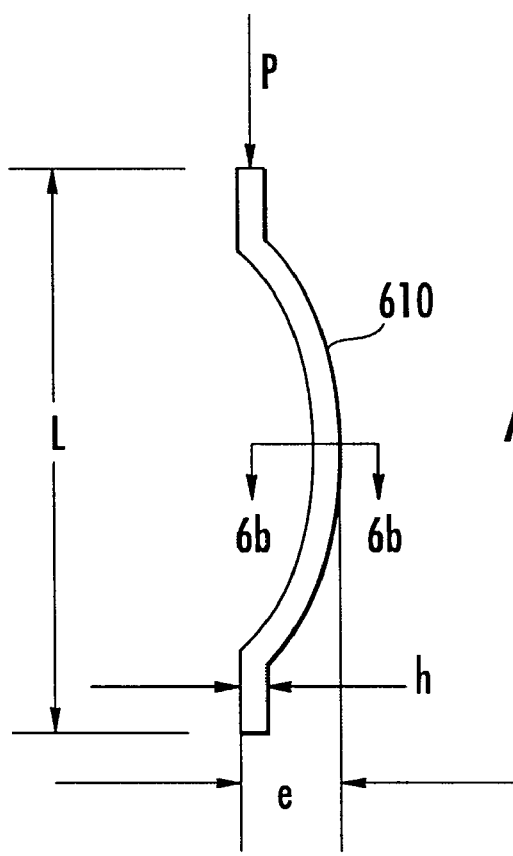
FIG. 6a is a side view of one rung of either the inner or outer conductor of FIG. 5a, and FIG. 6b is a cross-section of the rung.
Figure 6B:
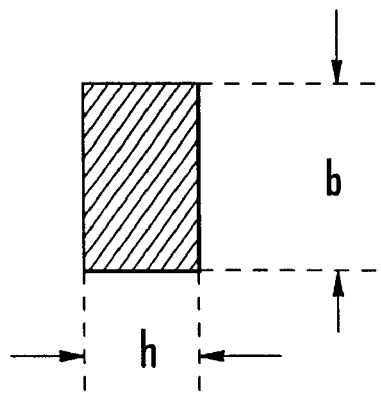

The bullet connector 400 of FIG. 5*a* can be axially compliant. In order for the bullet to be axially compliant, the individual longitudinally-oriented rungs of the ladder structure must also be compliant. The shape taken by the rung members (of either the inner or outer conductors) is illustrated in FIGS. 6*a* and 6*b*. In FIG. 6*a*, the rung-plus-elongated-support is illustrated as 610. These rungs are etched such that they are individual metal members oriented parallel to the axis of the connector. Each rung is connected to the other rungs at the ends, but they are independent of other rungs along the middle portion of their lengths. Each individual rung, then, acts as a long, slender column when subjected to an axial force P. A long slender column has the ability to withstand large axial deflection when subject to a constant axial force P. In other words, the force versus deflection ratio is not constant. The force P must be sufficiently large that it meets or exceeds the "buckling" force of the column, or the force required to cause the buckling. Taking the material of the conductive rung as beryllium-copper, a compressive member must meet the following relationship in order to be considered as a long slender column $$\frac{L_e}{r_n} \geq \sqrt{2\frac{\pi^2 E}{S_{yp}}} \quad 1$$

where:

$L_e$ is the equivalent length=0.5 for a column clamped at both ends;

$r_n$=radius of gyration;

E=Young's modulus=20 (10⁶) for beryllium copper;

$S_{yp}$=yield strength=100,000 psi for heat-treated beryllium copper.

The radius of gyration is determined as $$r_n = \sqrt{\frac{I}{A}} = \frac{\sqrt{\frac{1}{12}b_h^3}}{bh} = \sqrt{\frac{h^2}{12}} = \frac{h}{\sqrt{12}} \quad 2$$

where:

I=moment of inertia;

A=cross-sectional area;

b=width of rung as in FIG. 6*b*; and h=thickness of plate as in FIG. 6*b*. From equations (1) and (2)

$$\frac{L_e}{r_n} = \frac{\frac{L}{2}}{\frac{h}{12}} \geq \sqrt{\frac{2\pi^2(20 \times 10^6)}{100,000}} \quad 3$$

which yields 199.2 ≧ 62.8 thereby indicating that the beryllium copper rung members can be treated as long slender columns.

The critical load $P_{CR}$ for one rung member is determined by $$P_{CR} = \frac{\pi^2 EI}{L_e^2} = \left(\frac{1}{12}\right)\left(\frac{\pi^2 E b_h^3}{L_e^2}\right) \quad 4$$

where b is $b_{ic}$ for the inner conductor, and $b_{oc}$ for the outer conductor, as determined by $$P_{CR_{oc}} = \frac{1}{12}\frac{\pi^2(20 \times 10^6)(0.021)(0.002)^3}{\left(\frac{0.230}{2}\right)^2} = 0.209 \text{ lbs/member} \quad 5$$

and $$P_{CR_{oc}} = \left(\frac{1}{12}\right)\frac{\pi^2(20 \times 10^6)(0.0058)(0.002)^3}{\left(0 \cdot \frac{230}{2}\right)^2} = 0.58 \text{ lbs/member} \quad 6$$

so the total force to buckle a beryllium copper structure having sixteen rungs is $$P_T = 16 P_{CR} \quad 7$$

where:

$P_T$=Total compressive force to buckle either the inner or outer conductor member;

16=total number of beryllium copper rungs in each member;

$P_{CR}$=critical load for either the inner or outer conductor.

The total amount of compressive force required to buckle the inner conductor is 0.93 lb, while the total force required to buckle the outer conductor is 3.344 lb. Thus, the total force required to adequately compress the bullet interconnect is the sum of 0.93 plus 3.44 or about 4.37 lb, plus any force required to distort the elastomeric dielectric material, which will depend upon the material and exact structure. When subjected to this force, the column members buckle, such that a wide range of axial deflections can be accommodated while maintaining a substantially constant axial force. The buckling force can be selected over a wide range, depending upon parameters such as the number of rungs, conductor thickness, axial length, and the mechanical properties of the dielectric support.

Figure 7:
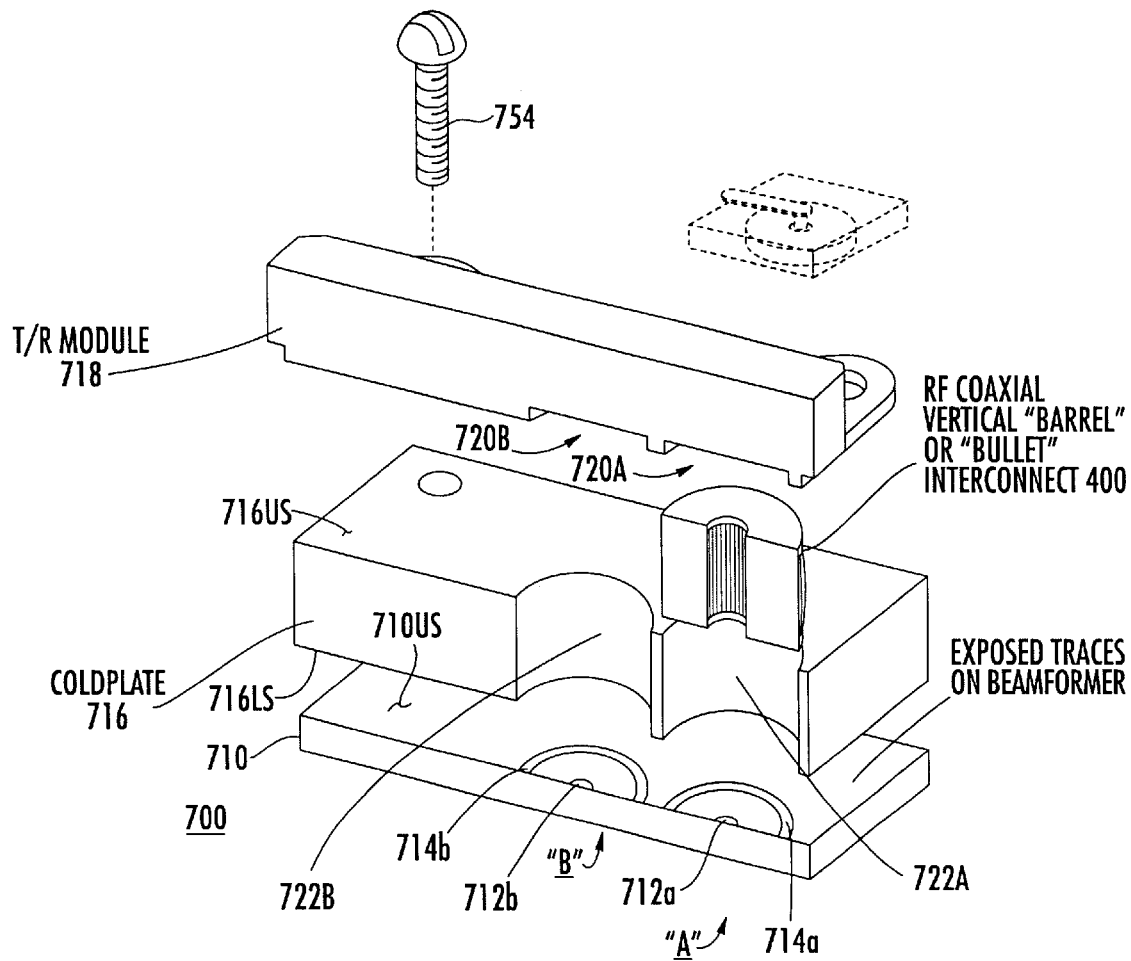
FIG. 7 is a simplified exploded view of a structure in which a bullet connector according to an aspect of the invention can be used, partially cut away to reveal interior details.

FIG. 7 is a simplified exploded view of a structure in which a bullet connector according to an aspect of the invention can be used, partially cut away to reveal interior details. In FIG. 7, exposed center conductive traces on a beamformer dielectric board 710 are designated 712a and 712b, and exposed outer conductor traces are designated 714a and 714b, respectively. These traces define electromagnetic ports having a coaxial cross-sectional shape: center trace 712a and outer trace 714a define an "A" RF port, while center trace 712b and outer trace 714b together define a "B" RF port. A cold plate 716 has a flat lower face for abutting at least portions of the upper surface 710us of beamformer 710. Cold plate 716 also defines a through aperture extending between its upper surface 716US and a lower surface 716LS and centered on each coaxial port defined by center and outer conductive traces. More particularly, an aperture 722A is registered with RF port A of beamformer 710, and an aperture 722B is registered with RF port B of beamformer 710. Each aperture 722 is dimensioned to clear the associated bullet connector. A TR module, which represents one of many such modules to be thermally coupled to the cold plate and electrically coupled to the beamformer, is represented by 718. TR module 718 has a locating depression which is registered with each of the RF ports of the beamformer, which in the case of FIG. 7 is the A and B RF ports. More particularly, a locating depression 720A is registered with the A RF port of beamformer 710, and a locating depression 720B is registered with the B RF port of beamformer 710. Within each depression 720A and 720B of TR module 718 lies a set of RF port metallizations corresponding to the inner and outer conductor metallizations of ports A and B of beamformer 710. A plurality of bullet connectors, only one of which is illustrated in FIG. 7, are provided for assembly with the structure. As illustrated, the bullet connector is connector 400 of FIG. 4. During assembly, the cold plate 716 is assembled to either the beamformer 710 or to the TR module 718, and a bullet connector is dropped into each aperture 722. The presence of the beamformer prevents the bullet connector from simply falling through the aperture 722. The next assembly, in this case the TR module, is affixed on the other side of the cold plate, effectively stopping up the apertures 722, so that the bullet connectors are captivated therein. The dimensions of the bullet connector are selected in conjunction with the thickness of the cold plate to cause the rungs of the ladder structures to act as long slender columns, so that they deflect to tend to maintain a substantially constant axial force.

This axial force, in turn, tends to keep the conductors of the bullet connector in intimate contact with the metallizations of the various RF ports with which they are associated.

Figure 1:
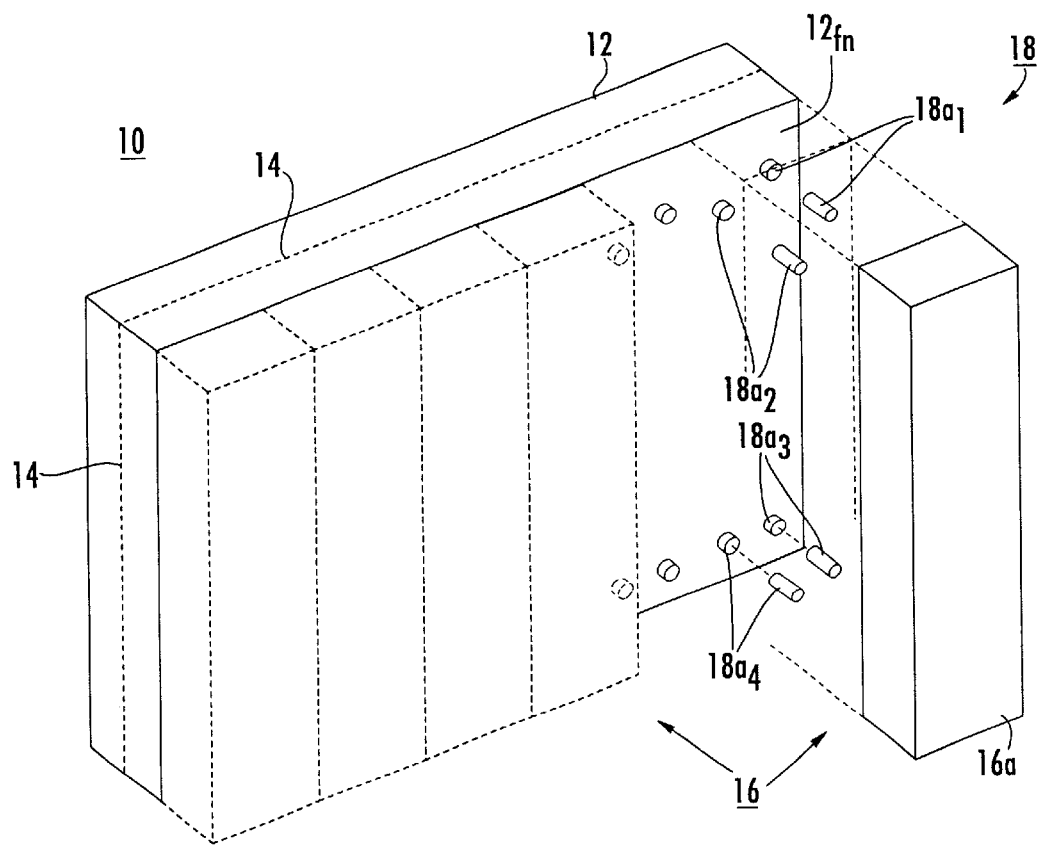
FIG. 1 is a simplified exploded view of a first housing adapted to be connected to a plurality of second housings.
Figure 2A:
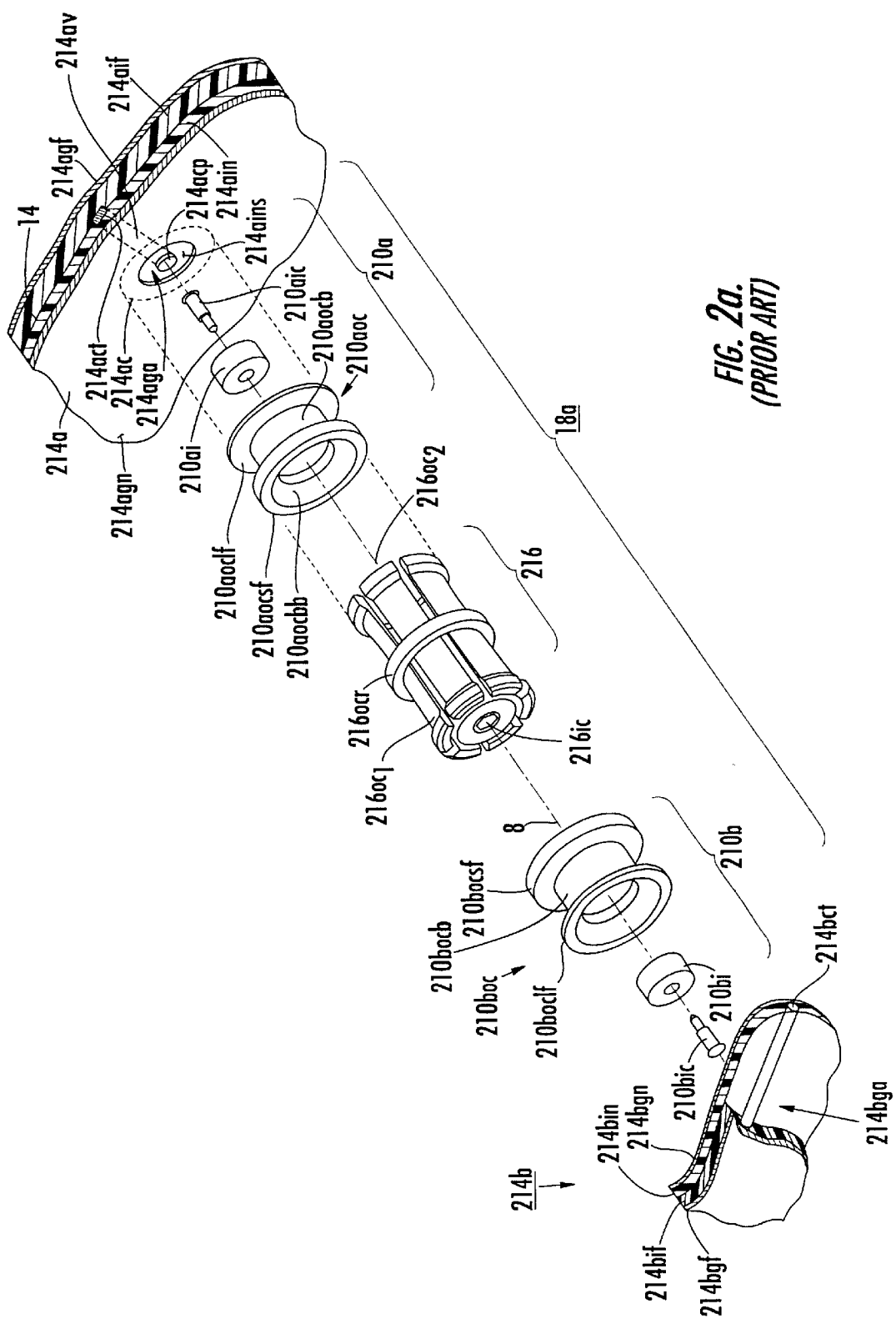
FIG. 2a is an exploded view of two printed-circuit stripline boards, each of which may be in a separate housing of FIG. 1, together with an interconnecting transmission line connector arrangement such as may be used in the prior art.
Figure 2B:
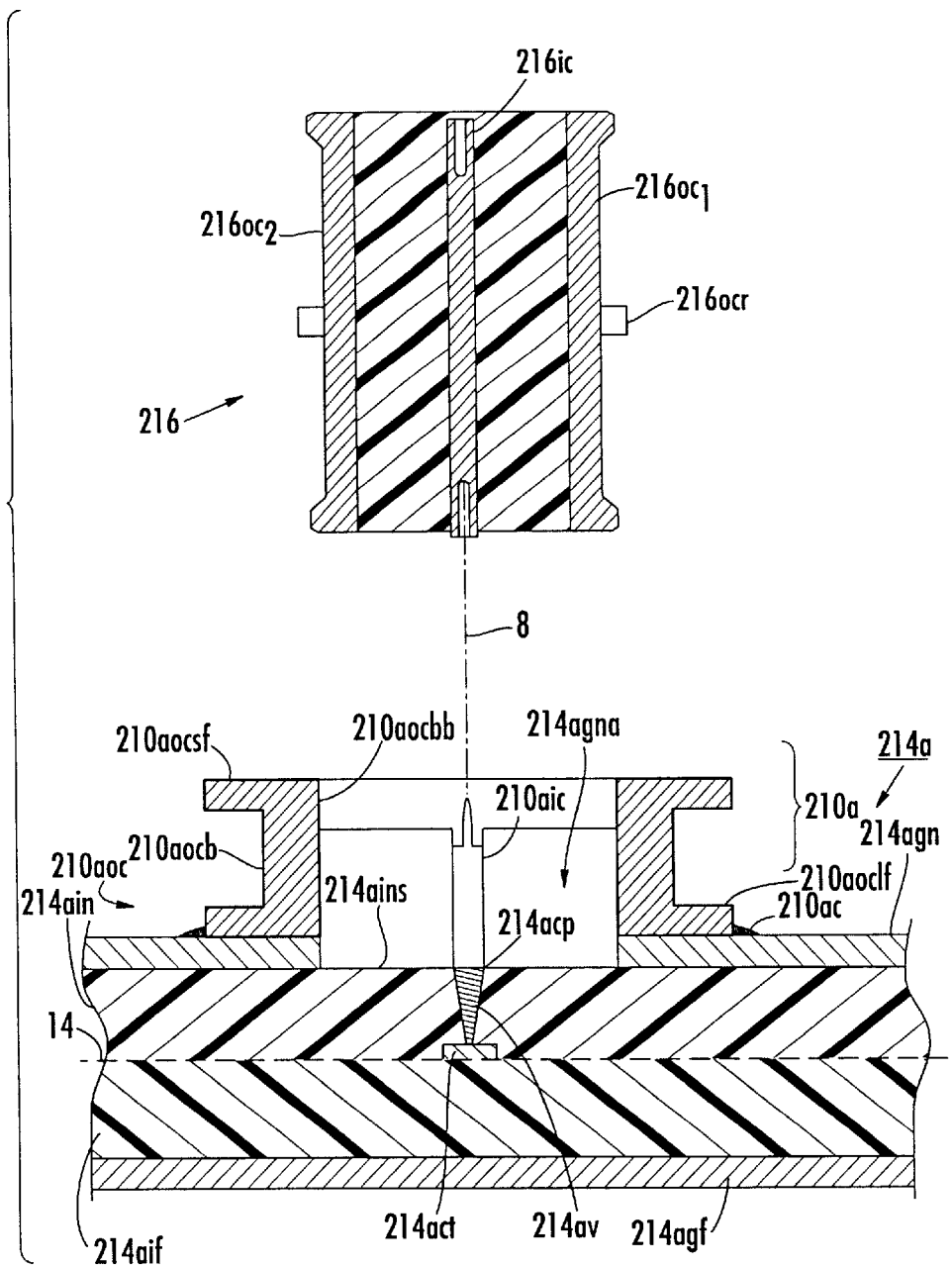
FIG. 2b is a cross-section of a portion of the arrangement of FIG. 2a in its assembled form.
Figure 8:
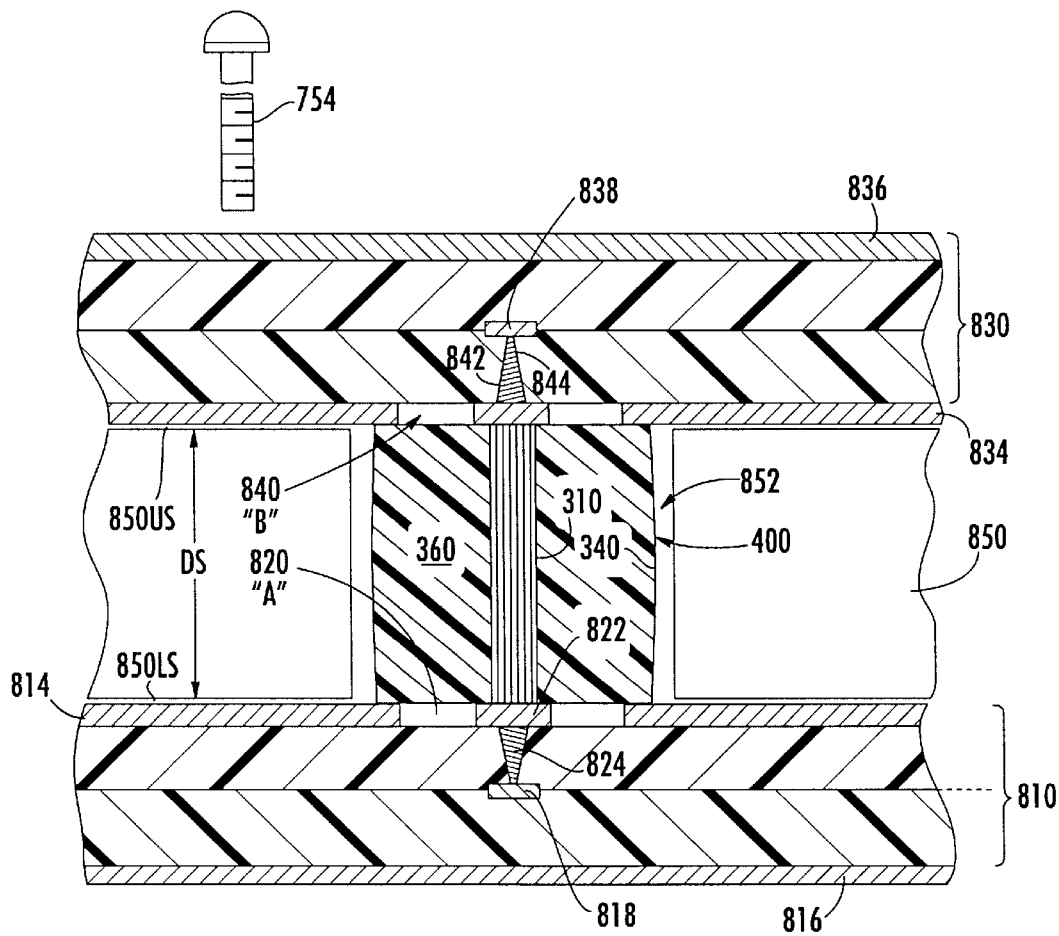
FIG. 8 is a cross-section of the arrangement of FIG. 7, illustrating details of the structure.

FIG. 8 is a cross-section of the arrangement of FIG. 7, illustrating details of the structure. In FIG. 8, a lower module board 810 is spaced away from an upper module board 830. Each board 810 and 830 is a stripline board similar to that described in conjunction with FIG. 2b, and each includes at least one conductive lead 818; 838 spaced by dielectric layers from ground planes 814, 816;834, 836. Each module board 810 and 830 also includes an RF port 820; 840 defined by a circular aperture in a ground plane 814; 834 together with a conductive pad 822; 842 centrally located within the associated aperture 820; 840. The conductive pad 822; 842 is connected by way of a plated-through via 824; 844 to the conductive trace 818; 838. The bullet connector 400 including the inner conductor 310, outer conductor 340, and dielectric elastomer 360, as described in conjunction with FIGS. 3a, 3b, 3c, and 4, lies in through aperture 852 defined in cold plate 850, and its center conductor 310 makes electrical contact with pads 822 and 842. The ends of outer conductor 340 make contact with ground plane 814 in a region around aperture 820 and with ground plane 834 in a region around aperture 840. The structure as a whole is held together by means including a screw or bolt 754.

Figure 9:
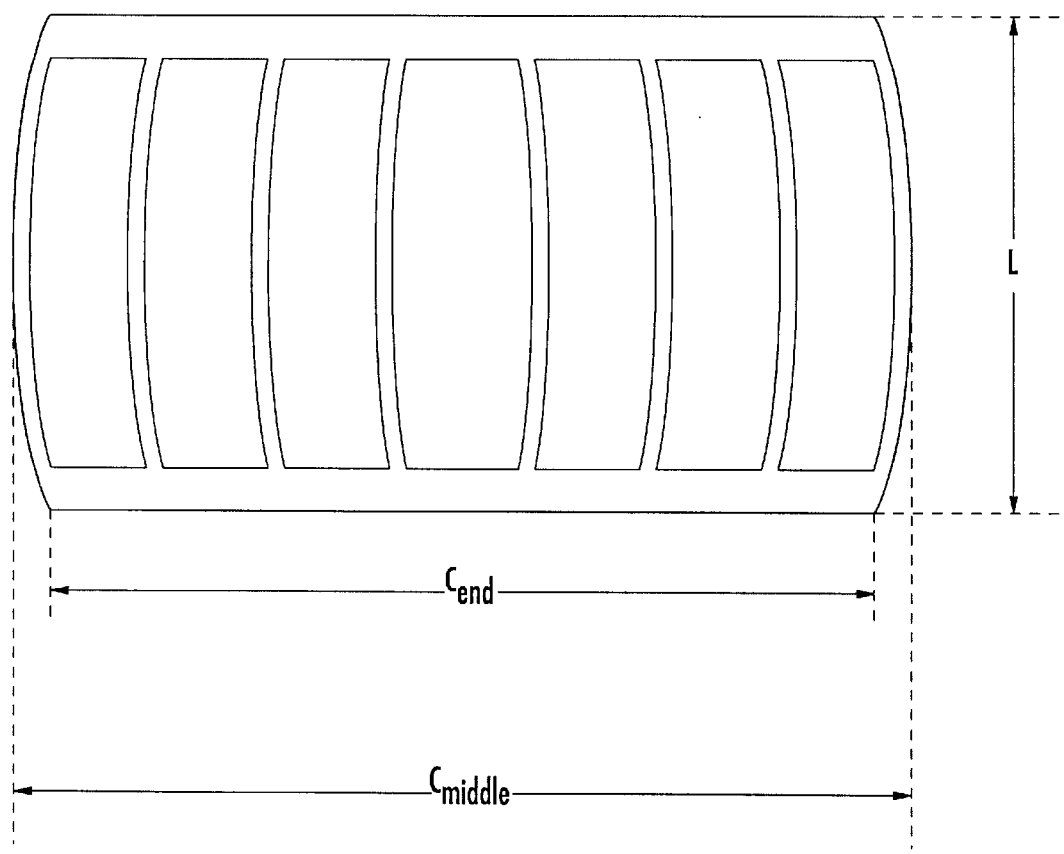
FIG. 9 illustrates a planar ladder structure suited for use with a dielectric piece such as that shown in FIGS. 3c and 4.

The planar ladder of FIG. 9 is equivalent to that of FIG. 3b, but its shape is adjusted or distorted so that the circumference represented by length $C_{MIDDLE}$ represents the circumference of the barrel-shaped dielectric 360 of FIG. 3c around its middle, remote from either end, while the circumference represented by length $C_{END}$ represents the lesser circumference at either end of the dielectric 360.

Other embodiments of the invention will be apparent to those skilled in the art. For example, the exposed portion of the outer conductor traces 714a and 714b may merely be a portion of a ground plane covering the near side of the beamformer board 710 of FIG. 7. While two RF connections have been illustrated in FIG. 7, those skilled in the art know that one or many such connections may be appropriate, and that the RF connections need not be associated with TR modules and beamformers, but may be any structure requiring RF connections between mutually parallel printed circuit boards, regardless of the number of layers of the boards.

Thus, an assemblage (800) according to an aspect of the invention includes a first stripline board (810) including first (814) and second (816) ground planes, and a circuit trace (818) lying between the first (814) and second (816) ground planes. The first ground plane (814) defines a circular first electromagnetic coupling aperture (820), and a conductive center trace (822) lies at the center of the first electromagnetic coupling aperture (820), to thereby define, in cross-section, a first coaxial transmission line structure (A). The center trace (822) of the first coupling aperture (820) connects by way of a plated-through via (824) to an end of the circuit trace (818) of the first stripline board (810). A second stripline board (830) includes first (834) and second (836) ground planes, and a circuit trace (838) lying between the first (834) and second (836) ground planes of the second stripline board (830). The first ground plane (834) of the second stripline board (830) defines a circular second electromagnetic coupling aperture (840), and a conductive center trace (842) lies at the center of the second electromagnetic coupling aperture (840), to thereby define, in cross-section, a second coaxial transmission line essentially identical to the first coaxial transmission line. The center trace (842) of the second coupling aperture (840) connects by way of a plated-through via (844) to an end of the circuit trace (838) of the second stripline board (830). A separator or spacer (850) defines two parallel planar surfaces (850US, 850LS) spaced from each other by a predetermined distance (DS). The separator (850) defines a circular through aperture (852) extending between the parallel planar surfaces (850US, 850LS). The through aperture (852) is larger in diameter than the first (820) and second (840) coupling apertures, and the separator (850) is physically fastened (bolt 754) to the first (810) and second (830) stripline boards so that the through aperture (852) is concentric with the first (820) and second (840) electromagnetic coupling apertures. An axially compliant third coaxial transmission line insert (400) includes a center conductor (310) coaxial with an outer conductor (340). At least one of the center conductor (310) and the outer conductor (340) of the third coaxial transmission line is in the form of a conductive ladder-shaped spring structure (FIGS. 3a, 3b) defining a plurality of rungs (312, 342) lying between elongated parallel members (314), which elongated members (314) are formed (FIG. 4) into curved shapes resembling circles, or at least portions thereof, so that the rungs (312, 342) lie generally parallel with each other and with the axis (8) of the other one of the center conductor (310) and the outer conductor (340).

The axially compliant third coaxial transmission line (400) lies within the through aperture (852) with a first end of the center conductor (310) abutting the center trace (822) of the first coaxial transmission line (A) and a second end of the center conductor (310) abutting the center trace (842) of the second coaxial transmission line (B of FIG. 8), and with a first end of the outer conductor (340) of the coaxial third transmission line (400) abutting the first ground plane (714a; 814) of the first stripline board (810) in a region surrounding the through aperture (820) of the first stripline board (810), and with a second end of the outer conductor (340) of the coaxial third transmission line (400) abutting the first ground plane (834) of the second stripline board (830) in a region surrounding the through aperture (840) of the second stripline board (830).

In a particularly advantageous avatar of the invention, both the center (310) conductor and the outer conductor (340) of the third coaxial transmission line (400) are in the form of a conductive ladder-shaped spring structure (FIGS. 3a, 3b) defining a plurality of rungs (sets 312, 342) lying between elongated parallel members (314a, 314b; 344a, 344b), with the elongated members formed into curved structures (FIG. 4) so that the rungs (312, 342) lie generally parallel with each other and with the axis (8) of the other one of the center conductor and the outer conductor. In such an arrangement, the elongated portions of the planar structures (FIGS. 3a, 3b) which are formed into circles may overlap (570) so that more than a complete "turn" of structure is formed, or may not quite overlap (370), so that a "gap" is left in one side of the structure. In this particularly advantageous avatar, the rungs (312, 342) of either the center conductor (310) or the outer conductor (340) of the third coaxial transmission line (400) may bulge away from the axis (8) of third coaxial transmission line (400) at regions remote from, or between, the elongated members (314a, 314b; 344a, 344b), to thereby form a somewhat barrel shape.

In a particular version of the structure, a generally barrel-shaped dielectric (360) form may occupy the interstice between the center (310) and outer (340) conductors, and, in a mode of making the connections, the dielectric form (360) may have the ladder of the outer conductor (340) wound thereabout. This dielectric form (360) is of a solid material, but may be an elastomeric solid material, and may be hollow if desired, so long as there is sufficient purchase at the through aperture to grasp the ends of the center conductor. The conductors of the ladders may comprise beryllium copper.

A method according to an aspect of the invention is for interconnecting transmission paths (A, B of FIG. 8) defined on the surface of first and second separated stripline boards (810, 830), where the transmission paths are in the form of a circular aperture (820, 840) defined in a conductive ground plane (814, 834) of the associated stripline board (810, 830), together with a conductive trace (822, 842) located at the center of the aperture (820, 840). The method includes the step of making a center conductor (310) having a nominal diameter by forming a first electrically conductive planar ladder-shaped spring structure (FIG. 3a) defining two elongated parallel elements (314a, 314b) and a plurality of rungs (312) extending therebetween into a tube-like form (FIG. 4) defined about an axis (8), so that the rungs (312) lie parallel with the axis (8). The method includes the forming of a second electrically conductive planar ladder-shaped spring structure (FIG. 3b) defining two elongated parallel elements (344a, 344b) and a plurality of rungs (342) extending therebetween into a second tube-like form (FIG. 4) defined about an axis (8), so that the rungs (342) lie parallel with the axis, to thereby define an outer conductor having a nominal diameter greater than the nominal diameter of the center conductor. The center conductor (310) is placed coaxially within the outer conductor (340) to thereby form a coaxial transmission line (400). The first (810) and second (830) stripline boards are juxtaposed with the circular apertures (820, 840) facing each other, and with the center (310) and outer (340) conductors of one end of the coaxial transmission line abutting the central trace (822) and a portion of the ground plane (814) surrounding the circular aperture (820), respectively, of the transmission path (A) of the first stripline board (810), and with the center (310) and outer (340) conductors of the other end of the coaxial transmission line (400) abutting the central trace (842) and a portion of the ground plane (834) surrounding the circular aperture (840), respectively, of the transmission path (B of FIG. 8) of the second stripline board (830), to thereby establish a coaxial electromagnetic transmission path between the transmission paths (A, B) of the first (810) and second (830) stripline boards. The first (810) and second (830) stripline boards are then fastened (754) together, including by way of intermediary structures (850), with the coaxial transmission path in place.

What is claimed is:

1. An assemblage, comprising:

a first stripline board including first and second ground planes, and a circuit trace lying between said first and second ground planes, said first ground plane defining a circular first electromagnetic coupling aperture, a conductive center trace lying at the center of said first coupling aperture, to thereby define, in cross-section, a first coaxial transmission line, said center trace of said first electromagnetic coupling aperture connecting by way of a plated-through via to an end of said circuit trace of said first stripline board;

a second stripline board including first and second ground planes, and a circuit trace lying between said first and second ground planes of said second stripline board, said first ground plane of said second stripline board defining a circular second electromagnetic coupling aperture and a conductive center trace at the center of said second electromagnetic coupling aperture, to thereby define, in cross-section, a second coaxial transmission line essentially identical to said first coaxial transmission line, said center trace of said second electromagnetic coupling aperture connecting by way of a plated-through via to an end of said circuit trace of said second stripline board;

a separator defining two parallel planar surfaces spaced from each other by a predetermined distance, said separator defining a circular through aperture extending between said parallel planar surfaces, said through aperture being larger in diameter than said first and second electromagnetic coupling apertures, said separator being physically fastened to said first and second stripline boards so that said through aperture is concentric with said first and second electromagnetic coupling apertures; and an axially compliant third coaxial transmission line insert including a center conductor coaxial with an outer conductor but not in electrical contact therewith, at least one of said center conductor and said outer conductor of said third coaxial transmission line being in the form of a conductive ladder-shaped spring structure defining a plurality of rungs extending between elongated parallel conductive members, said elongated members having a circular configuration such that said rungs lie generally parallel with each other and with an axis of the other one of said center conductor and said outer conductor, said axially compliant third coaxial transmission line lying within said through aperture with a first end of said center conductor abutting said center trace of said first coaxial transmission line and a second end of said center conductor abutting said center trace of said second coaxial transmission line, and with a first end of said outer conductor of said coaxial third transmission line abutting said first ground plane of said first stripline board in a region surrounding said through aperture of said first stripline board, and with a second end of said outer conductor of said coaxial third transmission line abutting said first ground plane of said second stripline board in a region surrounding said through aperture of said second stripline board.

2. An assemblage according to claim 1, wherein both said center conductor and said outer conductor of said third coaxial transmission line are in the form of a conductive ladder-shaped spring structure defining a plurality of rungs lying between elongated parallel members, said elongated members having a circular configuration such that said rungs lie generally parallel with each other and with said axis of the other one of said center conductor and said outer conductor.

3. An assemblage according to claim 1, wherein said rungs of said one of said center conductor and outer conductor of said third coaxial transmission line bulge away from said axis of third coaxial transmission line, to thereby define a barrel shape.

4. An assemblage according to claim 2, wherein said rungs of both said center conductor and outer conductor of said third coaxial transmission line bulge away from said axis of third coaxial transmission line, to thereby form each into a barrel shape.

5. An assemblage according to claim 4, wherein a solid dielectric material occupies an interstice defined between said rungs of said center and outer conductor of said third transmission line, wherein said solid dielectric material does not also occupy a region that is external to said rungs of said outer conductor.

6. An assemblage according to claim 1, wherein at least one of said center and outer conductors of said third transmission line comprises beryllium copper.

7. A method for interconnecting transmission paths defined on the surface of first and second separated stripline boards, where said transmission paths are in the form of a first and second circular apertures and a conductive central trace defined in a conductive ground plane of the first and second associated stripline boards, respectively, said method comprising the steps of:

forming a first electrically conductive planar ladder-shaped spring structure defining two elongated parallel elements and a plurality of rungs extending therebetween into a tube-like form defined about an axis, so that said rungs lie parallel with said axis, to thereby define a center conductor having a nominal diameter;

forming a second electrically conductive planar ladder-shaped spring structure defining two elongated parallel elements and a plurality of rungs extending therebetween into a tube-like form defined about an axis, so that said rungs lie parallel with said axis, to thereby define an outer conductor having a nominal diameter greater than said nominal diameter of said center conductor;

placing said center conductor coaxially within said outer conductor to thereby form a coaxial transmission line in which said center conductor and said outer conductor are electrically isolated;

juxtaposing said first and second stripline boards with said first circular aperture of said first stripline board and said second circular aperture of said second stripline board facing each other, and with said center and outer conductors of one end of said coaxial transmission line abutting said central trace and that portion of said ground plane surrounding said first circular aperture, respectively, of said transmission path of said first stripline board, and with said center and outer conductors of the other end of said coaxial transmission line abutting said central trace and that portion of said ground plane surrounding said second circular aperture, respectively, of said transmission path of said second stripline board, to thereby establish a coaxial transmission path between said transmission paths of said first and second stripline boards; and fastening said first and second stripline boards to each other with said coaxial transmission path in place.

8. A connector, comprising:

an electrically conductive center conductor in the shape of a single-longitudinal-split tube made up of a plurality of rungs extending between parallel elongated members lying in a curved path, said center conductor defining a nominal diameter and length;

an electrically conductive outer conductor in the shape of a single-longitudinal-split tube made up of a plurality of rungs extending between parallel elongated members lying in a curved path, said outer conductor defining a nominal diameter greater than said nominal diameter of said center conductor and a length equal to said length of said center conductor, said center conductor and said outer conductor being coaxially disposed relative to each other and electrically isolated from each other by an interstice lying between said center and outer conductors; and a dielectric spacer occupying at least a portion of said interstice between said center and outer conductors.

9. A connector according to claim 8, wherein said dielectric spacer comprises a solid dielectric material.

10. A connector according to claim 9, wherein said solid dielectric material is an elastomer.

11. A connector according to claim 8, wherein said rungs of said center and outer conductors are long slender columns.

* * * * *